US010405427B2

(12) United States Patent
Siddique

(10) Patent No.: US 10,405,427 B2
(45) Date of Patent: Sep. 3, 2019

(54) METHOD OF BONDING FLEXIBLE PRINTED CIRCUITS

(71) Applicant: FlexEnable Limited, Cambridge, Cambridgeshire (GB)

(72) Inventor: Sharjil Siddique, Cambridge (GB)

(73) Assignee: Flexenable Limited (GB)

( * ) Notice: Subject to any disclaimer, the term of this patent is extended or adjusted under 35 U.S.C. 154(b) by 0 days.

(21) Appl. No.: 15/306,063

(22) PCT Filed: Apr. 27, 2015

(86) PCT No.: PCT/GB2015/051220
§ 371 (c)(1),
(2) Date: Oct. 21, 2016

(87) PCT Pub. No.: WO2015/166222
PCT Pub. Date: Nov. 5, 2015

(65) Prior Publication Data
US 2017/0048977 A1 Feb. 16, 2017

(30) Foreign Application Priority Data
Apr. 28, 2014 (GB) .................................. 1407443.9

(51) Int. Cl.
*H05K 1/18* (2006.01)
*H05K 1/11* (2006.01)
(Continued)

(52) U.S. Cl.
CPC .............. *H05K 1/118* (2013.01); *H01L 24/83* (2013.01); *H01L 27/124* (2013.01); *H05K 1/147* (2013.01);
(Continued)

(58) Field of Classification Search
CPC ........... H05K 2203/0278; H05K 1/118; H05K 2201/10128; H05K 1/147; H05K 3/323;
(Continued)

(56) References Cited

U.S. PATENT DOCUMENTS 5,668,700 A 9/1997 Tagusa et al.
2007/0030433 A1* 2/2007 Kudo ................. G02F 1/13452 349/149
(Continued)

FOREIGN PATENT DOCUMENTS

JP 2003-086635 3/2003

OTHER PUBLICATIONS

Great Britain Search Report for Application No. GB1407443.9 dated Sep. 23, 2014.
(Continued)

*Primary Examiner* — Steven T Sawyer
(74) *Attorney, Agent, or Firm* — Knobbe, Martens, Olson & Bear, LLP

(57) ABSTRACT

A method for forming electrical connections between electrical conductors is provided. The method includes depositing an anisotropic conductive bonding material (AC bonding material) on a first plurality of electrical conductors, sandwiching the AC bonding material between the first plurality of electrical conductors and a second plurality of electrical conductors, providing first and second cushions formed of a thermally resistive and elastic material, and applying heat and pressure to the second cushion to form the AC bond between the first and second plurality of conductors.

17 Claims, 5 Drawing Sheets

(51) Int. Cl.

| | |
|---|---|
| ***H05K 3/32*** | (2006.01) |
| ***H05K 3/36*** | (2006.01) |
| ***H01L 23/00*** | (2006.01) |
| ***H01L 27/12*** | (2006.01) |
| ***H05K 1/14*** | (2006.01) |
| ***H05K 3/40*** | (2006.01) |

(52) U.S. Cl.
CPC ............. *H05K 3/323* (2013.01); *H05K 3/361* (2013.01); *H05K 3/40* (2013.01); *H01L 2224/83007* (2013.01); *H01L 2224/83203* (2013.01); *H01L 2224/83851* (2013.01); *H05K 1/189* (2013.01); *H05K 2201/10128* (2013.01); *H05K 2203/0278* (2013.01)

(58) Field of Classification Search
CPC .......... H05K 3/361; H05K 3/40; H01L 24/83; H01L 27/124; H01L 2224/83007
USPC .......................................................... 345/173
See application file for complete search history.

(56) References Cited

U.S. PATENT DOCUMENTS

| | | | | |
|---|---|---|---|---|
| 2007/0084566 | A1 | 4/2007 | Seki et al. | |
| 2007/0171347 | A1 | 7/2007 | Nakanishi | |
| 2008/0156434 | A1 | 7/2008 | Uematsu et al. | |
| 2009/0038753 | A1 | 2/2009 | Matsumura | |
| 2011/0096009 | A1* | 4/2011 | Kurokawa | G06F 3/0412 345/173 |
| 2012/0012153 | A1* | 1/2012 | Azechi | H01B 1/22 136/244 |
| 2012/0018084 | A1 | 1/2012 | Jang et al. | |
| 2014/0146491 | A1* | 5/2014 | Chan | H05K 1/189 361/749 |
| 2014/0345791 | A1* | 11/2014 | Son | B32B 37/0046 156/228 |

OTHER PUBLICATIONS

International Search Report for Application No. PCT/GB2015/051220 dated Jun. 23, 2015.

Written Opinion of the International Searching Authority for Application No. PCT/GB2015/051220 dated Jun. 23, 2015.

Examination Report dated Dec. 13, 2016 in corresponding application No. GB1407443.9.

Official Communication in United Kingdom Application No. GB1407443.9, dated Mar. 23, 2018, in 10 pages.

* cited by examiner

METHOD OF BONDING FLEXIBLE PRINTED CIRCUITS

CROSS-REFERENCE TO RELATED APPLICATIONS

This application is the U.S. National Phase under 35 U.S.C. § 371 of International Application No. PCT/GB2015/051220, filed Apr. 27, 2015, designating the United States and published in English on Nov. 5, 2015, as WO 2015/166222, which clams priority to United Kingdom Application No. 1407443.9, filed Apr. 28, 2014.

FIELD OF THE INVENTION

This invention relates to an improved method for bonding flexible printed circuits (FPCs) together, and in particular to heat bonding two FPCs with the same interconnection pitch.

BACKGROUND TO THE INVENTION

Many electronic devices, such as portable consumer devices and display devices, contain multiple independent circuits. For example, a smart phone may contain a circuit for driving the display and a separate circuit to receive and interpret a user's touch inputs. Such circuits usually need to be connected to other circuits and components within the device. Conventional wire-based connections are generally not used in modern devices, particularly in portable consumer devices, as wires take up more room within the device and make devices thicker, larger and heavier.

Instead, anisotropic conductive films (ACF) are often used in such devices to electrically connect circuits to other circuits, to the device's display panel and to the substrate. ACF bonding has been used to form electrical connections between flexible printed circuits (FPCs) and the glass-based substrates used in many electronic devices (flex-to-glass). As the consumer electronics industry moves toward using flexible plastic substrates in devices, ACF bonding has also been used to form connections between flexible substrates and PCBs (flex-to-board) as well as between flexible substrates and flexible circuit boards or other flexible substrates (flex-to-flex). ACF is often used to form such electrical connections because the bonding method is reliable, low cost and suitable for high-density connections, particular for fine interconnection pitch applications where the pitch is ≤100 μm.

Background information on ACF bonding can be found in: Ge et al, "Evaluation of Interposers in the ACF Bonding Process", Electronic Components and Technology Conference, Proceedings. 56th, 2006, p. 1499 to 1503; and Brackell, "Achieving Interconnection with Pulse-Heated Bonding", Circuits Assembly, April 2000, p. 46 to 50.

Although ACF is widely used, in cases where the interconnection pitch (i.e. the distance between neighbouring electrodes/electrical contacts) is fine (for example ≤100 μm), it is crucial that the upper and lower objects being bonded are aligned and remain aligned during the bonding process. The present applicant has recognised the need to improve the ACF bonding method to reduce the misalignment of interconnections, particularly for fine interconnection pitches.

SUMMARY OF THE INVENTION

Broadly speaking, anisotropic conductive adhesives are used to form electrical connections between components.

The ACF adhesive materials are generally applied between two components, and pressure and/or heat is applied to cure the adhesive between the parts and form a strong, long-lasting electrically conductive bond. The ACF bonding process may be used, for example, to connect electrical conductors on LCDs and other display panels to printed circuit boards (PCBs) that comprise the driver circuitry for the display, via a flexible PCB. ACF is also used to form bonds between flexible substrates, for example between two flexible PCBs. In the conventional ACF bonding process an assembly or bonding structure is formed, which comprises the elements that are to be bonded together, and a bonding head is then used to apply pressure and/or heat to the assembly. As the bonding head is in contact with one surface of the assembly, the heat and pressure applied may not be distributed uniformly through the assembly and the ACF adhesive may not cure across the full area being bonded. Furthermore, the bonding head is closer to one of the elements being bonded than the other, which, as a result of the non-uniform thermal energy distribution through the assembly, causes the element closer to the bonding head to heat and expand more than the element further away from the bonding head. This can cause misalignment of the conductors on the two elements. For example, if two flexible PCBs are being bonded together using the ACF process, one flexible PCB may expand to a greater degree than the other and the electrodes or conductive tracks of the PCBs become misaligned. Misalignments are undesirable and can, for example, lead to display devices having un-drivable displays.

In the conventional ACF bonding process, a single cushion is provided between the bonding head and one of the two elements being bonded together. Typically, as mentioned above, a bonding head applies pressure and heat to an assembly of components. The assembly typically comprises a first substrate, a second substrate, an adhesive between the two substrates, and a cushion. The assembly is generally placed on a rigid base or mount, such that the assembly is squeezed between the bonding head and the base/mount during the bonding process. The cushion is an intermediate layer between the bonding head and the nearer of the two substrates. Typically, the cushion is formed of an elastic material, specifically a material that is more elastic than the mount (which is necessarily rigid/non-flexible) and the bonding head (which is also usually non-flexible). The cushion may be formed of a material which has good thermal resistance. Thus, the cushion generally helps to achieve uniform thermal energy distribution across the assembly, and/or acts as a mechanical buffer to apply constant and even pressure to the assembly. The flexible/elastic cushion may force the adhesive material into the gaps between electrodes/conductive tracks on the two substrates to prevent voids after curing has taken place. However, the substrate which is nearer the bonding head may still heat up more than the substrate which is further away. In particular, the base/mount on which the assembly is placed is unheated and the substrate which is in contact with the base (and which is further away from the bonding head) may not heat up to the same temperature as the other substrate.

Thus, according to a first aspect of the present invention, there is provided a method for forming electrical connections between a first plurality of electrical conductors and a second plurality of electrical conductors, the method comprising: providing a first cushion on a mount; disposing a first substrate on the mount wherein a first side of the first substrate is in contact with the first cushion and a second side of the first substrate comprises the first plurality of electrical conductors; depositing an anisotropic conductive (AC) bonding material on the first plurality of electrical conductors; aligning a second substrate with the first substrate, wherein a first side of the second substrate comprises the second plurality of conductors, and wherein the second plurality of conductors are aligned with the first plurality of conductors such that the AC bonding material is sandwiched between the first side of the first substrate and the first side of the second substrate; providing a second cushion on the second substrate; applying heat and pressure to the second cushion to form the AC bond between the first and second plurality of conductors; wherein the first and second cushions are formed of a thermally resistive and elastic material to enable substantially uniform pressure and heat to be applied across the first and second plurality of electrical conductors when forming the AC bond.

The method does not require the various steps to be performed in the above-mentioned order, that is, the above does not imply an order of manufacturing. For example, the AC bonding material may be applied between the first and the second substrates before placing the assembly on the mount.

The following features apply to all aspects of the invention.

The anisotropic conductive (AC) bonding material may be provided as an anisotropic conductive film (ACF), as is commonly used to form electrical and mechanical connections between electronics and glass substrates. Additionally or alternatively, the AC material may be used in paste form (ACP), as used in particular chip-on-flex applications.

The first cushion is provided between a base/mount and the first substrate. Thus, a symmetrical assembly or stack may be formed between a bonding head used to apply heat and pressure to the assembly, and the base. The first and second cushions may perform the same functions, i.e. they may both act as a thermal insulator (because of its thermal resistance) and as a mechanical buffer (because of its relative elasticity/flexibility compared to the mount and bonding head), as mentioned above. Advantageously, the first cushion insulates the first substrate from the (cold) base, and enables thermal energy from the bonding head to be distributed through the assembly, such that both first and second substrates expand by the same amount.

The thermally resistive material of one or both of the first and second cushions may have a thermal conductivity in the range of 0.5 W/mK to 1.5 W/mK. One or both of the first and second cushions may be formed of a silicone-based material, such as silicone rubber. Experiments have found cushions formed from silicone rubber have the desired elasticity and thermal resistivity to enable uniform heat distribution through the assembly and to apply uniform pressure to the assembly.

One or both of the first and second cushions have a thickness of at least 300 μm.

The first and second cushions may be both formed of a first material having a thermal conductivity in the range of 0.5 W/mK to 1.5 W/mK, wherein the first and second cushions have substantially identical thickness.

The first and second cushions may be formed of the same material and have the same thickness. Experiments suggest that cushions formed of silicone rubber and having a thickness of ≥300 μm (±100 μm) results in uniform thermal transfer across the assembly. The plurality of electrodes on the first and second substrates may stand proud of the substrate, for example, they may protrude by 8 μm from a surface of the substrate. Thus, it is important that the adhesive material is pushed into the gaps between neighbouring electrodes in order to form a stable and durable bond. Experiments suggest that the cushion thickness affects the ability to squeeze the adhesive into these gaps, and a cushion thickness of at least 300 μm helps to achieve this.

Alternatively, the first cushion may be formed of a first material and the second cushion may be formed of a second material, wherein the first and second materials each have a thermal conductivity in the range of 0.5 W/mK to 1.5 W/mK, and wherein the first and second cushions have substantially identical thickness.

One or both of the first and the second substrates may be a flexible printed circuit board. Advantageously, this may enable a flexible display device, such as a flexible LED/OLED display panel, to be manufactured. The substrate may be formed of a flexible polymer such as PVC, PET (polyethyleneterephthalate) or PEN (polyethelenemaphthalene), thermoplastic polyurethane (TPU), Polymethyl methacrylate (PMMA), PC (polycarbonate), PEEK (polyetheretherketone), PI (polyimide), cyclo-olefin copolymer (COC) or cyclic olefin polymer (COP).

An interconnection pitch of both the first plurality of electrical conductors and the second plurality of electrical conductors may be less than or equal to 100 μm.

The method may involve using a bonding head to apply a temperature of less than or equal to 180° C. to the assembly, and applying a pressure of between approximately 2 MPa to 4 MPa.

One or both of the first and the second substrates may be coupled to a display panel, which may be formed of a flexible material.

The invention also provides a method of manufacturing an electronic device using the above-described method, wherein the electronic device comprises a display and/or a sensor module, an active or passive matrix backplane, a flexible printed circuit board connector, and a printed circuit board.

The display module may comprise an electrophoretic display (EPD), liquid crystal display (LCD) or an active-matrix organic light-emitting diode (AMOLED) display, and may be flexible.

The sensor panel may be a large area flexible image sensor, and may comprise an array of organic photodetectors. The sensor panel may be driven by a flexible thin film transistor (TFT) backplane, preferably a flexible, plastic organic TFT backplane. Such a sensor panel may be used in a variety of applications, for example: digital image sensing, smart packaging, medical equipment, biomedical diagnostics, fingerprint scanning, and gesture recognition. The TFT array may use either inorganic or organic semiconductors.

According to a further aspect of the invention, there is provided a bonding structure comprising: a first plurality of electrical conductors provided on a first side of a first substrate; a second plurality of electrical conductors provided on a first side of a second substrate; an anisotropic conductive film (ACF) bond between the first plurality of electrical conductors and the second plurality of electrical conductors; a first cushion adjacent to a second side of the first substrate; a second cushion adjacent to a second side of the second substrate; wherein the first and second cushions are formed of a thermally resistive and elastic material to enable substantially uniform pressure and heat to be applied across the first and second plurality of electrical conductors when forming the ACF bond.

BRIEF DESCRIPTION OF THE DRAWINGS

The invention is diagrammatically illustrated, by way of example, in the accompanying drawings, in which.

DETAILED DESCRIPTION OF THE DRAWINGS

Figure 1A:
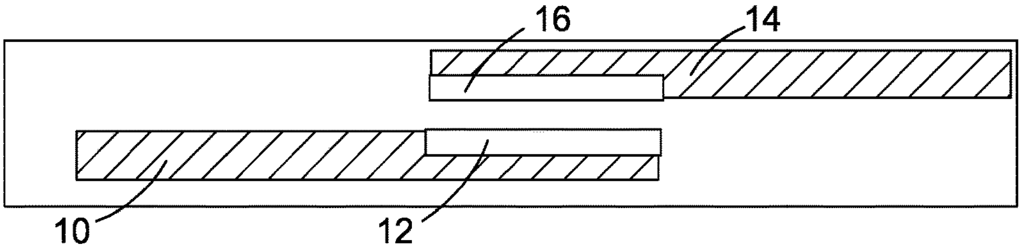
FIGS. 1*a* to 1*f* show a conventional step-by-step process of ACF bonding two flexible printed circuits.

FIGS. 1*a* to 1*f* show a conventional step-by-step process of ACF bonding two flexible printed circuit boards. As mentioned above, ACF is an adhesive system used to form electrical and mechanical connections between driver electronics and substrates. ACF may be used to form various assemblies, e.g. flex-to-glass, flex-to-board and flex-to-flex connections. ACF interconnections are particular useful for forming connections between flexible printed circuit boards (PCBs) where the electrodes have low height and/or a fine interconnection pitch (which enables high-density connections).

Generally, ACF bonding requires a combination of heat and pressure to be applied to the objects being connected. In the example process shown in FIGS. 1*a* to 1*f*, a first (lower) substrate 10 having a plurality of electrodes 12 is to be bonded to a second (upper) substrate 14 having a plurality of electrodes 16. Each of the substrates 10, 14 may be rigid or flexible, and in particular, may be flexible printed circuit boards (FPCBs). The flexible PCBs typically used in electronic devices are high-density, i.e. the interconnection pitch or distance between adjacent electrodes is ≤200 μm or even ≤100 μm. The description below and FIGS. 1*a* to 1*f* do not imply an order of manufacturing steps, but merely illustrate an example ACF bonding process.

Figure 1B:
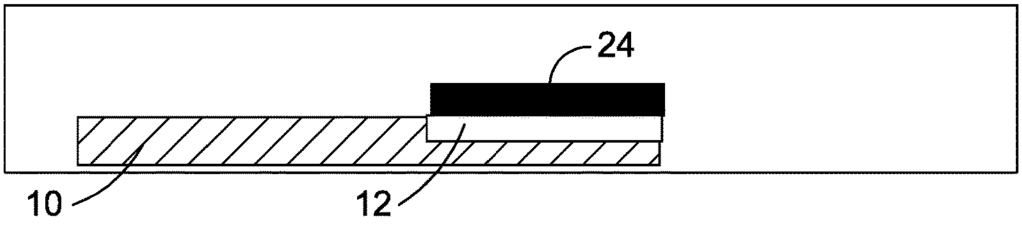
Figure 1C:
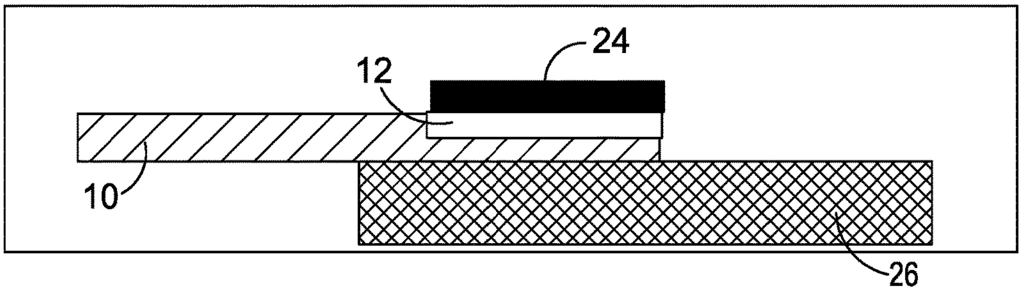

As shown in FIG. 1*b*, the ACF bonding process requires depositing an anisotropic conductive material or adhesive 24 over the first plurality of electrodes 12. The anisotropic material may be an epoxy resin or an acrylic-based material. The deposition may be performed using an ACF lamination process, by printing or otherwise. (Precise details of the manufacturing techniques used in the ACF bonding process are not provided here but are well known in the art.) The first (lower) substrate 10 may be placed on a base or mount 26 during the bonding process for stability. This base/mount may be a glass or metal block which may be part of a small, medium or high-volume manufacturing apparatus. In the process described here, the assembly is formed on glass base 26—see FIG. 1*c*.

Figure 1D:
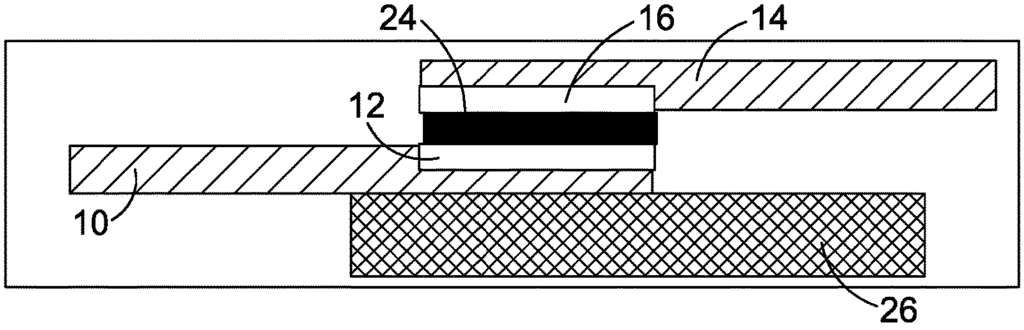
Figure 1E:
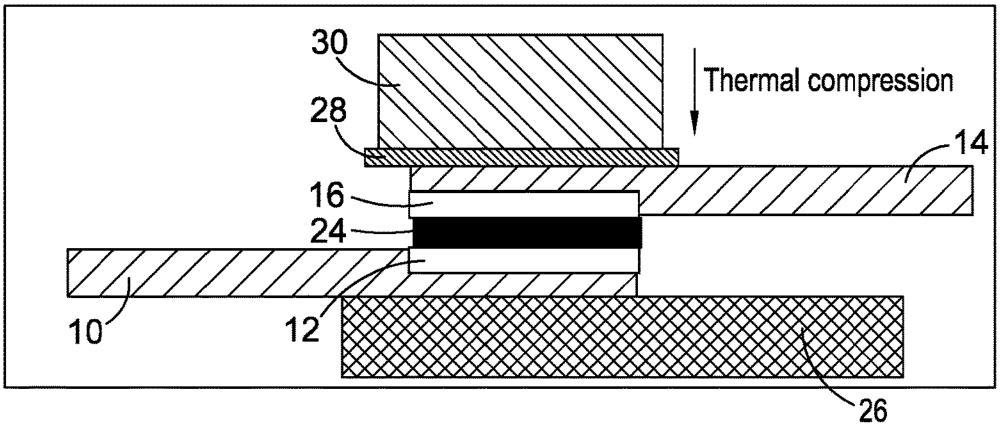

The second (upper) substrate 14 is positioned over the first substrate 10 such that the portions of each substrate which are to be bonded together are aligned. As shown in FIG. 1*d*, the plurality of electrodes 12 on the lower substrate and the plurality of electrodes 16 on the upper substrate are aligned relative to each other, and the adhesive 24 is in contact with both sets of electrodes. For large pitch connections (≥500 μm), manual alignment techniques may be used, whereas for fine pitch ≤200 μm) the alignment may be performed using cameras/optical techniques.

As mentioned earlier, the ACF bonding process requires a combination of heat and pressure to form the conductive, stable interconnections between two flexible PCBs. A bonding head 30 or similar device is often used in a pre-bonding stage of the process to apply a minimal amount of heat to cause the adhesive material to become tacky (see FIG. 1*e*). The substrates 10, 14 may be further aligned during this pre-bonding stage so that the electrode tracks 14, 16 are aligned.

Figure 1F:
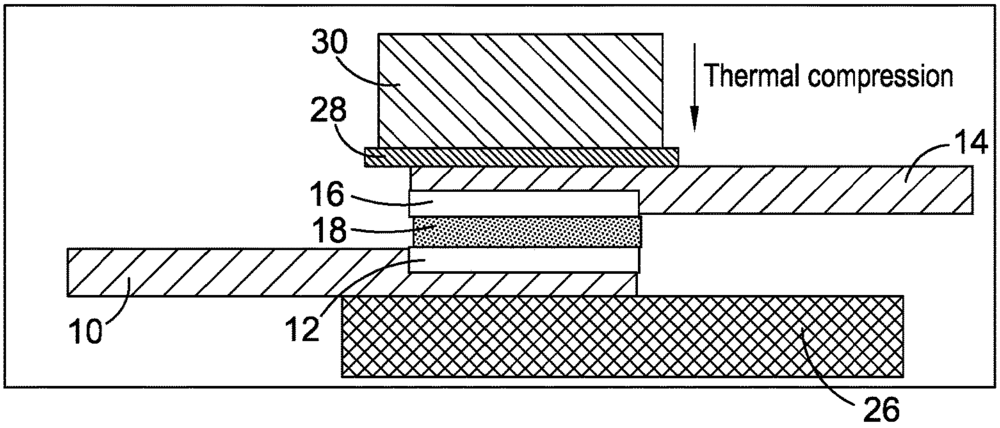

During the final bonding stage of the process, the bonding head 30 applies more heat and pressure to the assembly to compress the assembly and cure the adhesive (FIG. 1*f*). The heat transfer from the ceramic or metallic bonding head 30 to the adhesive material 24 is often not efficient or uniform, due to the thermal conductivity of the materials, the thickness of the substrates and the unevenness of the surfaces (see e.g. Ge et al (ibid)). A cushion 28 or interface layer is typically provided on the top of the second, upper substrate 14. The cushion 28 is an intermediate layer between the bonding head 30 and the upper substrate 14 and helps to achieve uniform thermal energy distribution across the adhesive material 24, and/or acts as a mechanical buffer to apply constant and even pressure to the assembly. The cushion 28 also forces the adhesive material into the gaps between the electrode tracks 14, 16. Thermal compression of the assembly between the bonding head 30 and the glass base 26 results in the adhesive material 24 being cured and an ACF bond 18 being formed between the plurality of electrodes 12, 16 (see FIG. 1*f*). The amount of heat applied depends on the amount of thermal energy required to cause the adhesive to flow over and between the plurality of electrodes 12, 16, and on the energy required to cure the adhesive to form a stable bond. The amount of heat may also depend on the assembly being formed and the adhesive used.

Figure 4:
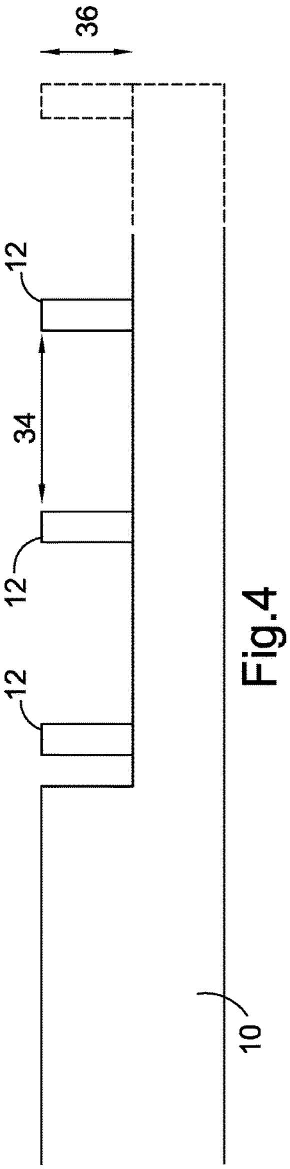
FIG. 4 shows a zoomed-in view of a substrate comprising electrical conductors.

Modern flexible PCBs have a fine interconnection pitch to enable high density connections. FIG. 4 shows a zoomed-in sketch of a flexible PCB 10 with a plurality of electrodes or electrode tracks 12. As shown in the sketch, the electrodes 12 protrude from a surface of substrate 10. Modern flexible PCBs may have an electrode height or thickness 36 of 8 μm, and an interconnection pitch 34 of ≤200 μm or even ≤100 μm. Thus, when using ACF bonding to form connections between flexible PCBs, it is important that the adhesive material covers the electrodes 12 and flows into the gaps between electrodes, so that the adhesive bonds to a larger surface area of and forms a stable and long-lasting bond. Furthermore, it is important that the electrodes of each flexible PCB are aligned.

However, in the conventional ACF bonding process shown in FIGS. 1*a* to 1*f*, as heat is applied to the assembly from above, i.e. by bonding head 30, the upper substrate 14 (which is nearer to the bonding head than the lower substrate 10) heats and expands. This expansion of the upper substrate 14 causes misalignment between the plurality of electrodes 12, 16, and results in a faulty connection between the two flexible PCBs.

Figure 2:
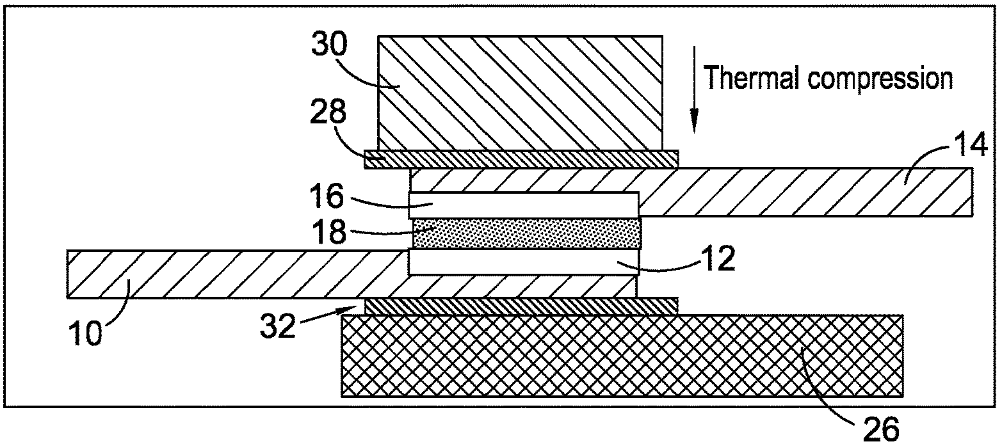
FIG. 2 illustrates a method of ACF bonding two flexible printed circuits according to an embodiment of the invention.

The present application provides a solution to this problem. Turning now to FIG. 2, this illustrates a method of ACF bonding two flexible printed circuits according to an embodiment of the invention. Here, a second cushion 32 is used in the ACF bonding process. The second cushion 32 is provided between the jig or glass base 26 and the first (lower) substrate 10. Thus, as shown in FIG. 2, the present invention provides a symmetrical assembly or stack between the bonding head 30 and the glass block 26. The second cushion 32 is preferably formed of a flexible and thermally resistive (i.e. insulating) material. The second cushion 32 performs the same functions as the first, upper cushion 28. Specifically, the second cushion 32 acts as a thermal insulator between the first substrate 10 and the glass block 26, and as a mechanical buffer. The glass block 26 is generally colder than the bonding head 30 and thus, in the conventional arrangement where the glass block 26 and the first substrate 10 are in direct contact (see FIG. 1*f*), the first substrate 10 may not heat up to the same temperature as the second (upper) substrate 14. Consequently, the upper substrate expands while the lower substrate does not (or expands less so than the upper substrate), and the electrodes 12, 16 become misaligned. Thus, advantageously, the second cushion 32 insulates the first substrate from the cold glass block 26, and enables thermal energy from the bonding head 30 to be distributed through the assembly, such that both substrates 10 and 14 expand by the same amount.

Furthermore, the second cushion 32 acts as a mechanical buffer and enables uniform pressure to be applied to the assembly, particularly to the bottom of the assembly. When pressure is applied to the assembly by the bonding head 30, the flexible cushion 32 accounts for unevenness in the various assembly layers and pushes the electrodes 12 into the adhesive material. Advantageously, the flexibility of the cushion 32 forces the electrodes into the adhesive material such that the adhesive is pushed into the gaps between electrodes, thereby providing a more stable bond when the adhesive is cured.

As mentioned above, it is desirable that the cushions are formed of a flexible material, preferably one with a low thermal conductivity (i.e. thermally insulating). The material may have a thermal conductivity of between approximately 0.5 W/mK and 1.5 W/mK. However, the skilled person will understand that a material with a different thermal conductivity but which insulates the lower substrate from the colder jig/glass block below it may be used. The cushions 28, 32 may be formed of a silicone-based material, such as but not limited to silicone rubber, which is a flexible and thermally insulating material. Materials such as Kapton or Teflon (RTM) are flexible and thermally insulating and thus, may be used to form the cushions 28, 32, though experiments suggest that, unlike silicone-based cushions, they do not provide 100% electrode alignment.

The cushions 28, 32 may have substantially identical thickness. In particular, experiments indicate that a cushion thickness of ≥300 μm (±100 μm) results in uniform thermal transfer across the assembly. Experiments also suggest that a cushion thickness of less than 300 μm is insufficient for uniform thermal transfer and results in misaligned electrodes.

During the ACF bonding process, the bonding head 30 may apply a pressure of between 2-4 MPa and a temperature of ≤180° C. to the assembly for ≤20 s, in order to cure the adhesive material and form a stable, long-lasting bond between the substrates/flexible PCBs. (The exact pressure, temperature and time may vary, dependent on the substrates and/or ACF being bonded and the adhesive material used).

The first cushion 28 and the second cushion 32 may be formed of the same material and may have the same thickness. Experiments indicate that identical cushion material type and thickness results in 100% electrode alignment.

Figure 3:
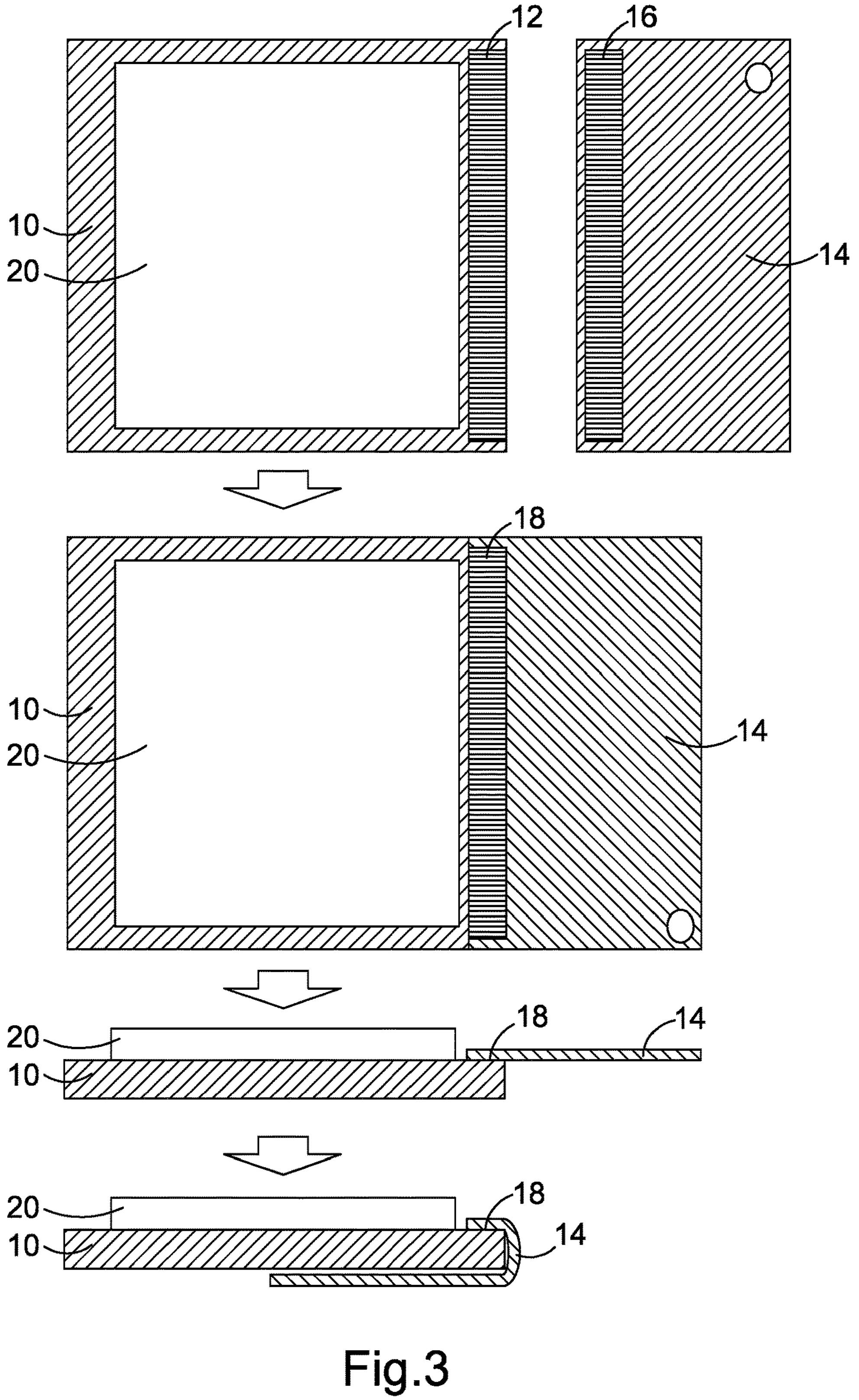
FIG. 3 illustrates an example use of the ACF bonding method according to an embodiment of the invention.

FIG. 3 illustrates an example use of the ACF bonding method. Here, substrate 10 may be an active matrix backplane (i.e. an array of thin film transistors or organic TFTs) bearing a plurality of pixel driver circuits to drive a display panel 20. Additionally or alternatively, substrate 10 may be a TFT backplane for driving a sensor panel. The sensor panel may be comprised of an array of photodetectors (or organic photodetectors), which may be used for a range of applications, such as: digital image sensing, smart packaging, sensors for medical equipment and biomedical diagnostics, and security and mobile commerce (user identification by fingerprint scanning). The sensor array may be used to add gesture recognition interaction to consumer electronics devices (e.g. laptops, tablets, and smartphones), which may make conventional input devices such as mouse, keyboards, and even touch-screens redundant. In both examples, the substrate 10 and the display/sensor panel 20 may be flexible, and may be formed of flexible plastic. Thus, the display device or sensor (e.g. a large area image sensor) may be fully flexible.

The ACF bonding technique may be used to couple substrate 10 to a second substrate 14, which may comprise a second display, logic circuitry, a sensor array, electronics to drive the display or sensor panel 20, or an adaptor board for AMOLED displays. Substrate 10 comprises a plurality of electrodes 12 and substrate 14 comprises a plurality of electrodes 16. As shown in FIG. 3, many display devices comprise a display 20 which are coupled to a large area of substrate 10, and the electrodes or conductive tracks 12 are confined to a relative small area on the substrate, often along an edge of the backplane. Thus, a fine interconnection pitch between electrodes/tracks 12 is required. Interconnections between the plurality of electrodes 12 and 16 are formed using an ACF bond 18, using the process described above with respect to FIG. 2. The second substrate 14 may be formed of a flexible material such as a flexible plastic. If the thickness of the second substrate 14 is substantially thin, for example ≤75 μm, the second substrate 14 can be folded entirely behind the first substrate 10, as shown, thereby enabling the manufacture of a compact (thin) electronic device and/or a fully flexible device.

Figure 5:
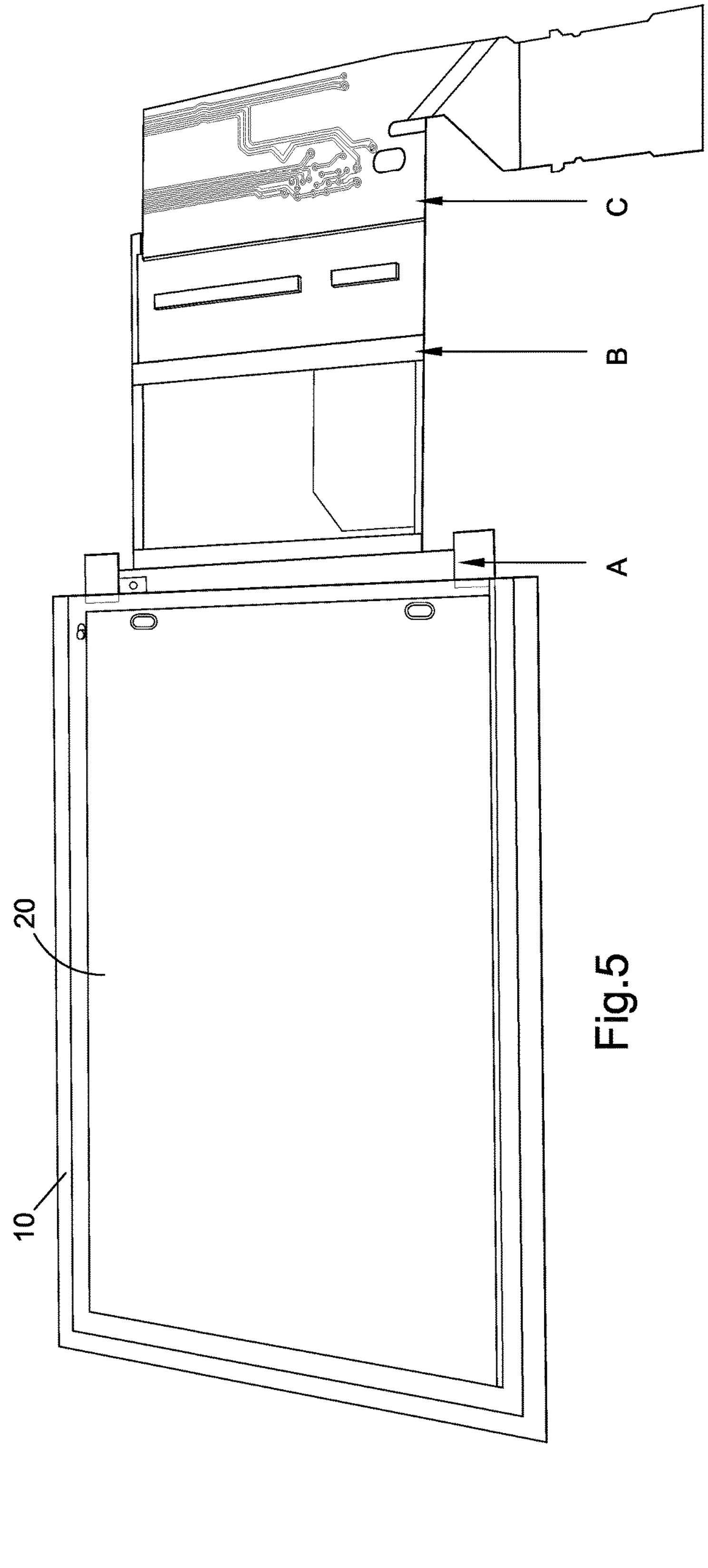
FIG. 5 shows a further example of the use of ACF bonding.

The ACF bonding process of the present application can be used to form electrical and mechanical connections in a variety of assemblies. As described above, the process can be used to connect together a rigid substrate to a flexible substrate, and to connect together two flexible printed circuit boards. FIG. 5 shows a further example of the use of ACF bonding. Here, a display panel 20 is coupled to a flexible backplane/substrate 10. ACF bond are formed to connect electrodes on the backplane 10 to a flexible substrate (bond A), to form a flex-to-flex bond (bond B) and to connect a flex to a flexible PCB 14 (bond C).

Figure 6:
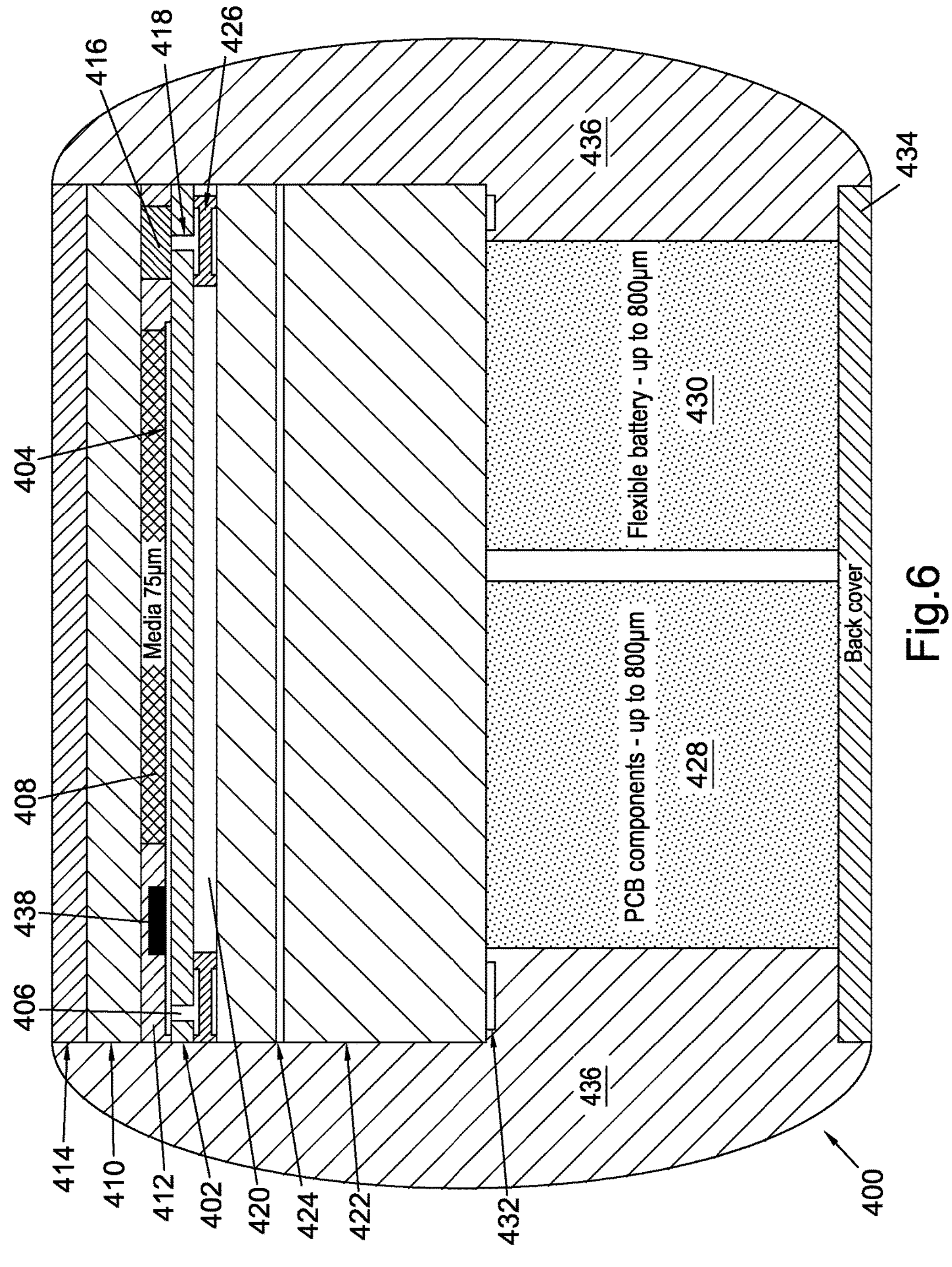
FIG. 6 shows a detailed vertical cross-section view through a flexible display panel formed using the ACF bonding process.

Referring now to FIG. 6, this shows a vertical cross-section view through a flexible display panel 400 in which electronic components of the device are distributed over a surface of the device on a flexible PCB, and in which electrical connections may be made between various electronic components of the device using the ACF bonding process described above.

In more detail, the structure comprises a substrate 402, typically a plastic such as PET (polyethyleneterephthalate) or pen(polyethelenemaphthalene) on which is fabricated a thin layer of organic active matrix pixel circuitry. The circuitry may comprise an array of organic (or inorganic) thin film transistors for example as previously described in our WO01/47045, WO2004/070466, WO01/47043, WO2006/059162, WO2006/056808, WO2006/061648, WO2006/106365 and WO2007/029028. Broadly speaking, the backplane may be fabricated using solution based techniques patterned by, for example, direct-right printing, laser ablation or photolithography to fabricate the thin film transistors. The active devices may have a thickness of order 5-10 μm. This layer may have a thickness of order 50 μm and has integrated encapsulation. This substrate/backplane layer bears row and column, dataline and address conductive tracks 404, connected to the rear of substrate 402 by vias 406. We here refer to front as being towards the display surface of the device and rear as being towards the rear of the device.

A display medium 408 is attached to substrate 402, for example by adhesive. The display medium may be a reflective display medium (which facilitates daylight reading), for example an electrophoretic display medium or an electrofluidic display medium. Where an electrophoretic display medium is employed a colour display may be provided by providing a colour filter array 410 over the display medium; optionally this may also perform an encapsulation function. Additionally or alternatively a moisture barrier may be provided over the display, for example comprising polyethylene and/or Aclar™ (a fluropolymer, polychlorotrifluoroethylene-PCTFE). The thickness of the display medium may be of order 75 μm and that of the encapsulation/colour filter array may be of order 120 μm.

Where an electrofluidic display is employed, for example of the type available from Gamma Dynamics, Inc. Ohio USA, the colour filter array may be omitted. The use of an electrofluidic display facilitates improved brightness/contrast as well as near video display update rates and high resolution, and may be of order 225 pixels per inch.

Whichever display medium is employed, an edge seal 412 may be provided to seal the edge of display medium 408 to the edge of the display module.

A front window 414 is provided over the display, for example comprising a thin layer of PMMA (polymethylmethacrylate), and may have a thickness of order 300 μm or PET, or may have a thickness of order 75 μm. Where the device is touch sensitive, this layer may also include conductive row and column lines for the touch circuitry, and may employ fine line metal (FLM). The touch sensing circuitry may be operable by finger and/or a stylus. A connection to the touch sensing layer may be made by a Z-axis conductive pad 416 which connects to the touch electrodes in window 414 through CFA/encapsulation layer 410 (for example by vias, not shown) and vias 418 through substrate 402 bring the touch array connections to contact pads on the rear of substrate 402.

An adhesive layer 420 connects the substrate 402 to a flexible PCB 422 (which may incorporate circuitry 424 for an inductive stylus sensor). Connections between the contact pads on the rear of substrate 402 and the flexible PCB employ anisotropic conductive film (ACF) 426, where the connections may be formed using the ACF process described above with reference to FIG. 2. The illustrated structure facilitates the omission of a separate moisture barrier under substrate 402, although such a barrier may be incorporated if desired.

Flexible PCB 422 carries electronic components 428, for example surface mounted components, and a thin film flexible polymer battery 430. The PCB 422 may have a thickness of order 600 μm, and the components/battery have a thickness up to 800 μm. Flexible PCB 422 also bears a conductive loop 432 around the border of the device for inductive charging of battery 430.

The components and battery are provided with a thin rear cover 434 (optional). The display and PCB module is encapsulated, for example by a gel-based potting material or encapsulant 436 which may fill all the internal gaps, extending around the edge of the display module, over the flexible PCB, and attaching rear cover 434.

No doubt many other effective alternatives will occur to the skilled person. It will be understood that the invention is not limited to the described embodiments and encompasses modifications apparent to those skilled in the art lying within the spirit and scope of the claims appended hereto.

What is claimed is:

1. A method for forming electrical connections between a first plurality of electrical conductors and a second plurality of electrical conductors, the method comprising:

providing a first cushion on a mount;

disposing a first substrate on the mount wherein a first side of the first substrate is in contact with the first cushion and a second side of the first substrate comprises the first plurality of electrical conductors;

depositing an anisotropic conductive (AC) bonding material on the first plurality of electrical conductors;

aligning a second substrate with the first substrate, wherein a first side of the second substrate comprises the second plurality of electrical conductors, and wherein the second plurality of electrical conductors are aligned with the first plurality of electrical conductors such that the AC bonding material is sandwiched between the first plurality of electrical conductors and the second plurality of electrical conductors;

providing a second cushion on the second substrate;

applying heat and pressure to the second cushion to form an AC bond between the first plurality of electrical conductors and the second plurality of electrical conductors;

wherein the first cushion is formed of a first thermally resistive and elastic material and the second cushion is formed of a second thermally resistive and elastic material to enable substantially uniform pressure and heat to be applied across the first plurality of electrical conductors and the second plurality of electrical conductors when forming the AC bond, wherein the first and second cushions have identical thickness, wherein the first and second cushions have a thickness of at least 300 μm, and wherein each of the first thermally resistive and elastic material and the second thermally resistive and elastic material has a thermal conductivity in the range of 0.5 W/mK to 1.5 W/mK, the second substrate has a thickness of less than or equal to 75 μm,the second substrate is folded behind the first substrate, and an interconnection pitch of both the first plurality of electrical conductors and the second plurality of electrical conductors is less than or equal to 100 μm.

2. A method as claimed in claim 1 wherein the first thermally resistive and elastic material is the same as the second thermally resistive and elastic material.

3. A method as claimed in claim 2 wherein at least one of the first thermally resistive and elastic material and the second thermally resistive and elastic material is silicone rubber.

4. A method as claimed in claim 1 wherein at least one of the first substrate and the second substrate is a flexible printed circuit board.

5. A method as claimed in claim 1 wherein the heat applied to the second cushion is less than or equal to 180° C.

6. A method as claimed in claim 1 wherein the pressure applied to the second cushion is between 2 MPa to 4 MPa.

7. A method as claimed in claim 1 wherein at least one of the first and the second substrate is coupled to a display panel.

8. A method as claimed in claim 7 wherein the display panel is formed of a flexible material.

9. A method of manufacturing an electronic device using the method of claim 1, wherein the electronic device comprises a display module, an active matrix backplane, a flexible printed circuit board connector, and a printed circuit board.

10. A method of manufacturing an electronic device as claimed in claim 9 wherein the display module comprises an electrophoretic display, a liquid crystal display (LCD) or an active-matrix organic light-emitting diode (AMOLED) display.

11. A method of manufacturing an electronic device using the method of claim 1, wherein the electronic device comprises a sensor panel, a flexible thin film transistor backplane, a flexible printed circuit board connector, and a printed circuit board.

12. A method of manufacturing an electronic device as claimed in claim 11 wherein the sensor panel is flexible and comprises an array of photo detectors.

13. A bonding structure comprising:

a first plurality of electrical conductors provided on a first side of a first substrate;

a second plurality of electrical conductors provided on a first side of a second substrate;

an anisotropic conductive (AC) bond between the first plurality of electrical conductors and the second plurality of electrical conductors;

a first cushion adjacent to a second side of the first substrate;

a second cushion adjacent to a second side of the second substrate;

wherein the first cushion is formed of a first thermally resistive and elastic material and the second cushion is formed of a second thermally resistive and elastic material to enable substantially uniform pressure and heat to be applied across the first plurality of electrical conductors and the second plurality of electrical conductors when forming the AC bond, and wherein the first and second cushions have identical thickness, wherein the first and second cushions have a thickness of at least 300 μm, and wherein each of the first thermally resistive and elastic material and the second thermally resistive and elastic material has a thermal conductivity in the range of 0.5 W/mK to 1.5 W/mK, the second substrate has a thickness of less than or equal to 75 μm, the second substrate is folded behind the first substrate, and an interconnection pitch of both the first plurality of electrical conductors and the second plurality of electrical conductors is less than or equal to 100 μm.

14. A bonding structure as claimed in claim 13 wherein the first thermally resistive and elastic material is the same as the second thermally resistive and elastic material.

15. A bonding structure as claimed in claim 13 wherein the first and second cushions are formed of silicone rubber.

16. A bonding structure as claimed in claim 13 wherein at least one of the first and the second substrate is a flexible printed circuit board.

17. A bonding structure as claimed in claim 13 wherein at least one of the first and the second substrate is coupled to a display panel.

* * * * *